United States Patent [19]
Kim et al.

[11] Patent Number: 5,965,939
[45] Date of Patent: Oct. 12, 1999

[54] SEMICONDUCTOR DEVICE AND A METHOD OF MANUFACTURE

[75] Inventors: Kyeong-tae Kim, Seoul; Yun-seung Shin, Kyungnki-do; Young-hun Park; Won-mo Park, both of Kyungki-do; Ji-hong Ahn, Seoul, all of Rep. of Korea

[73] Assignee: Samsung Electronics Co., Ltd., Rep. of Korea

[21] Appl. No.: 08/838,044

[22] Filed: Apr. 22, 1997

Related U.S. Application Data

[60] Continuation of application No. 08/487,406, Jun. 7, 1995, abandoned, which is a division of application No. 08/042,490, Apr. 16, 1993, Pat. No. 5,488,007.

[30] Foreign Application Priority Data

Apr. 16, 1992 [KR] Rep. of Korea ......................... 92-6393
Nov. 10, 1992 [KR] Rep. of Korea ....................... 92-20972

[51] Int. Cl.[6] .................................................. H01L 23/48
[52] U.S. Cl. .......................... 257/752; 257/296; 257/306; 257/307; 257/308; 257/309; 257/752; 438/632; 438/698; 438/703; 438/926
[58] Field of Search ..................... 257/306, 307, 257/308, 309, 296, 752; 437/52, 47, 48; 438/632, 698, 703, 926

[56] References Cited

U.S. PATENT DOCUMENTS

| | | | |
|---|---|---|---|
| 4,505,025 | 3/1985 | Kurosawa et al. ........................ | 29/576 |
| 4,764,483 | 8/1988 | Fuse et al. ................................ | 437/67 |
| 4,882,289 | 11/1989 | Moriuchi et al. ........................ | 437/52 |
| 5,204,288 | 4/1993 | Marks et al. ............................. | 437/228 |
| 5,218,219 | 6/1993 | Ajika et al. .............................. | 257/752 |
| 5,386,382 | 1/1995 | Ahn ......................................... | 365/174 |
| 5,406,103 | 4/1995 | Ogawa ..................................... | 257/306 |

*Primary Examiner*—Valencia Martin Wallace
*Attorney, Agent, or Firm*—Cushman Darby & Cushman IP Group of Pillsbury Madison & Sutro LLP

[57] ABSTRACT

A semiconductor device having a closed step portion and a global step portion including an insulating layer having a planarized surface on the global step portion is provided. A dummy pattern is formed by forming an insulating layer on the global step portion and then patterning through a photolithography process. After forming the dummy pattern for compensating steps in the global step portion and between the closed step portion and the global step portion, a BPSG layer is formed on both the closed step portion and the global step portion, and then the BPSG layer is heat-treated to cause it to reflow. The BPSG layer as an insulating interlayer having a planarized surface. The improved planarization decreases the occurrence of notching and discontinuities in the succeeding metallization processes thereby enhancing the yield and electrical characteristics of the semiconductor device.

9 Claims, 6 Drawing Sheets

SEMICONDUCTOR DEVICE AND A METHOD OF MANUFACTURE

This is a continuation of application Ser. No. 08/487,406, filed on Jun. 7, 1995, now abandoned, which was a division of application Ser. No. 08/042,490, filed Apr. 16, 1993, now U.S. Pat. No. 5,488,007.

BACKGROUND OF THE INVENTION

1. Field of the Invention

The present invention relates to a semiconductor device having a closed step portion and a global step portion and more particularly to a semiconductor device which includes a dummy pattern for planarizing the global step portion of the semiconductor device.

2. Description of the Related Art

In recent years, greater and greater numbers of active elements have been formed on a single substrate in manufacturing more highly integrated circuits. In the initial steps of the manufacturing process each active element is formed separately. The individual elements are interconnected during subsequent steps of the manufacturing process in order to obtain a desired circuit function. Accordingly, MOS and bipolar VLSI and ULSI devices typically have multilevel interconnection structures for achieving the desired element interconnection.

In such an interconnecting structure, the increase in the number of layers also increases the roughness of the top layer topography. For example, when manufacturing a semiconductor wafer having at least two interconnecting metal layers, a first insulating interlayer is formed about a first metal layer (which in turn, has been formed above other layers, such as a plurality of oxide layers, a polycrystalline silicon conductive layer, and a semiconductor wafer). A via hole is then formed in the insulating interlayer to permit the second metal layer to contact the first metal layer. Because the topography below the first insulating interlayer is uneven, the surface of the first insulating interlayer is also uneven. When the second metal layer is directly formed on this first insulating interlayer, the second metal layer is subject to fractures and thinning due to the uneven topography of the first insulating interlayer. These metallization defects degrade the yield and reliability of the semiconductor device. Accordingly, in multilevel metal interconnection, planarization of the insulating interlayer is necessary prior to forming the via holes or second metal layer.

Dynamic random access memories (DRAMs) generally consist of a cell array region for storing data, each cell having a single transistor and a single capacitor, and a peripheral circuit region for storing or transmitting data to each cell by driving the cell array. In the production of VLSI and ULSI DRAMs, the production of VLSI and techniques for providing sufficient capacitance for the cell capacitor have been developed which include forming a stacked storage electrode of the cell capacitor or by increasing the height of the storage electrode. The more densely packed the semiconductor device is, the greater the number of steps of the patterns formed in the cell array region. In addition, the vertical step differential between the surfaces of the cell array region and the peripheral circuit region is increased.

The simplest method for planarizing the semiconductor wafer having steps is to deposit CVD-$SiO_2$ thicker than the steps to be coated. However, since a thicker insulating layer increases the depth of the via between the first and second metal layers, this method is impractical. Moreover, as the spacing between the first metal layers is narrowed, voids may be formed in the insulating layer when the $SiO_2$ is deposited with conventional chemical vapor deposition (CVD). Another method has been disclosed wherein, after depositing an insulating interlayer as described above, a sacrificial resist layer is formed and etched back, thereby planarizing the insulating interlayer. However, not only are the etch-back processing conditions difficult to adjust, but an additional insulating layer must be deposited to complete the process. Thus, the process becomes overly complicated.

An alternative planarization method has been proposed wherein an insulating layer having a reflow characteristic is formed in place of the common CVD-$SiO_2$, and then heat-treated, thereby planarizing the insulating layer. For example, in "Silicon Processing for the VLSI Era" (S. Wolf, Vol. 2, 1990, pp. 208 and 209), a borophosphosilicate glass (BPSG) layer having 4.8 wt % boron and 4.6 wt % phosphorous is formed and then annealed at 900° C. for 30 minutes in a nitrogen ambient, thereby obtaining an insulating layer having a nearly planar surface. Other proposed planarization methods include rapid thermal processing, which also maintains a shallow junction region rapid thermal processing, or a reflow method of BPSG using, e.g., a CVD apparatus which can simultaneously perform deposition and reflow. In addition, Japanese Patent Publication No. 3-212958 (Korean Patent Publication No. 91-15046) discloses a method for enhancing the planarization by successively repeating the formation and heat-treating of the BPSG layer.

FIGS. 1 and 2 are schematic diagrams showing a conventional BPSG reflow technique. Referring to FIG. 1, a conductive layer is formed by depositing a metal or polysilicon on a semiconductor substrate 100, and is then patterned and etched to form a first wiring pattern 1. Thereafter, a BPSG layer 2 is formed on semiconductor substrate 100 having pattern 1 thereon. Referring to FIG. 2, the reflow of BPSG layer 2 is then carried out by heat treatment at a temperature of 900° C. for 30 to 60 minutes to obtain a nearly planar surface.

However, utilizing the conventional BPSG reflow method described above, if the step structure consists of both closed steps in densely patterned regions and global steps between regions or where patterns are more widely spaced, the degree of planarization at the global step is reduced. This lack of uniform planarization thus degrades the reliability and yield of the semiconductor device, since notching or discontinuities in the metal wiring may occur during the subsequent metal wiring process.

FIG. 3 illustrates the uneven surface of the BPSG layer formed at the global step after reflow. Here, a reference numeral 200 designates a semiconductor substrate; 21 is a pattern; 22 is a BPSG layer; $I_1$ is a closed step portion; $I_2$ is a global step portion; $x_1$ is the spacing between patterns in the closed step portion; $x_2$ is the spacing between patterns in the global step portion; $t_2$ is the difference between the peak height of BPSG layer 22 and the height of BPSG layer 22 in the global step portion; and $t_3$ is the thickness of BPSG layer 22 formed on pattern 21. As can be seen in FIG. 3, after executing the reflow heat-treatment, the planarization of the BPSG layer in the closed step portion having narrow spacing between patterns is relatively good, but that of the global step portion having distant spacing between patterns is inferior.

As disclosed in the above-mentioned Japanese Patent publication, the unevenness of the global step portion is not improved by repeating the BPSG coating and heat-treatment.

SUMMARY OF THE INVENTION

Accordingly, it is the object of the present invention to provide a semiconductor device including an insulating layer having excellent planarization in a global step portion, and a method for manufacturing the same.

To achieve the above object there is provided a semiconductor device comprising: a lower structure having a closed step portion and at least one global step portion; a dummy pattern to compensate for the step difference between the closed step portion and the global step portion of the lower structure; and a planarized insulating layer formed on the lower structure having the dummy pattern thereon.

Alternatively, there is provided a semiconductor device comprising: a semiconductor substrate; an impurity-doped region formed in the surface portion of the semiconductor substrate; a field oxide layer for defining an active region formed on the semiconductor substrate; a cell array region including a bit line formed on the field oxide layer, an insulating layer for insulating the bit line, a storage electrode of a capacitor formed on the insulating layer by being electrically connected with the impurity-doped region, a dielectric film formed on the storage electrode, and a plate electrode formed on the dielectric film; a peripheral circuit region formed in the peripheral region of the cell array region, with the insulating layer for insulating the bit line extending into the peripheral circuit region; a dummy pattern to compensate for the step difference between the cell array region and the peripheral circuit region; and a planarized insulating layer formed on the dummy pattern and plate electrode of the cell array region.

In order to manufacture a semiconductor device according to the present invention, there is provided a method for manufacturing a semiconductor device having a closed step portion and at least one global step portion which comprises the steps of: forming a dummy pattern to compensate for the difference between the closed step portion and the global step portion; and forming an insulating layer on the closed step portion and global step portion. The insulating layer thus obtained may be planarized by reflowing the insulating layer through a heat-treatment. Here, after the first insulating layer is formed over the closed step portion and global step portion, a photoresist pattern for the dummy pattern formation is formed on the global step portion-and the first insulating layer is then etched using the photoresist pattern as an etching mask, to form the dummy pattern.

By forming the dummy pattern to compensate for the steps in the global step portion, the step differential with respect to the closed step portion is decreased. Therefore, an insulating layer having a more uniformly planarized surface can be formed on a semiconductor wafer having closed steps and global steps.

BRIEF DESCRIPTION OF THE DRAWINGS

The above objects and other advantages of the present invention will become more apparent by describing in detail preferred embodiments with reference to the attached drawings in which.

DESCRIPTION OF THE PREFERRED EMBODIMENTS

The preferred embodiments of the present invention are described in detail below.

First Embodiment

Figure 4:
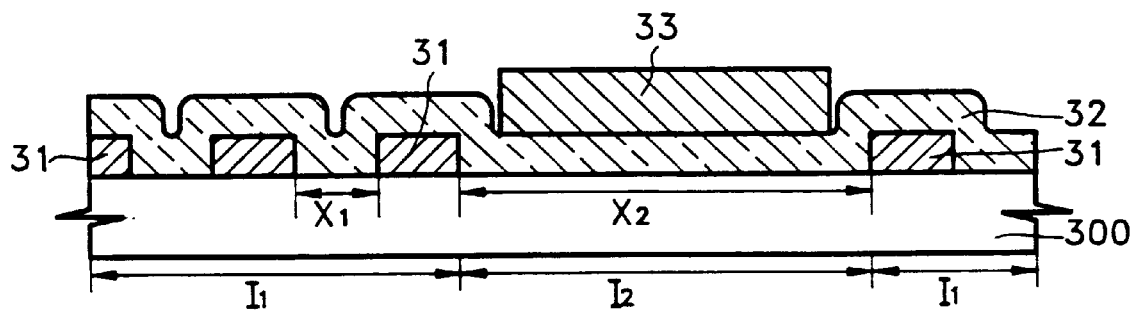
FIGS. 4, 5, and 6 are schematic views showing a first embodiment of the present invention.
Figure 5:
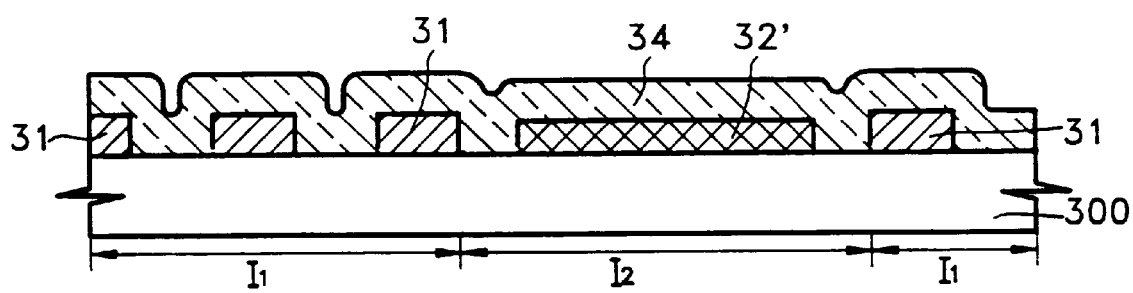
Figure 6:
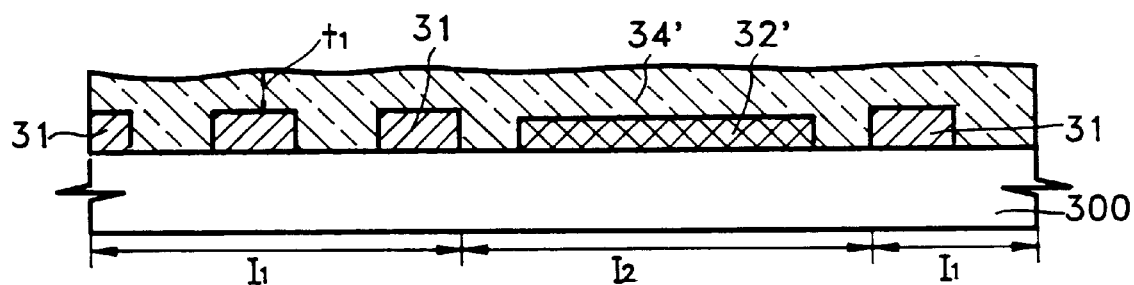

FIGS. 4 through 6 are schematic views showing a first embodiment of the present invention.

FIG. 4 illustrates a step of forming a photoresist pattern 33 for forming a dummy pattern, which is used to compensate for the step difference in a global step portion. More particularly, patterns 31 constituting elements of a semiconductor device are formed on a lower structure such as a semiconductor substrate 300. A gate electrode, word line, bit line, metal wiring, and, in the case of a memory device, the capacitor of a memory cell, are examples of elements that may be formed on the substrate.

These elements are composed of conductive materials, and are generally electrically insulated from one another, but electrical connection between specific elements is necessary to carry out the desired circuit functions. An active region, having an n-type or p-type impurity-doped region for performing the specific function and an isolation region, having a field oxide layer for electrically separating the active regions may be formed in the surface portion of the semiconductor substrate. The spacing between elements may be as short as $x_1$ or as long as $x_2$. A region having the shorter spacing $x_i$ is a closed step portion $I_1$ and a region having the longer spacing $x_2$ is a global step portion $I_2$. The dimensions of $x_1$ and $x_2$ differ according to the thicknesses of the elements and the insulating layer formed for insulating the elements. In this embodiment, when the spacing between elements is at least several factors greater (e.g., a factor of three times greater) than the difference between the final thickness of the insulating layer and the height of the element (denoted by $t_1$ in FIG. 6), the region is referred to as the global step portion $I_2$. Meanwhile, when the spacing is less than several factors times the difference, the region is referred to as the closed step portion $I_1$. The precise dimensions are not determinitive, but rather differences in dimensions that cause planarization concerns. In other words, $x_2$ of global step portion $I_2$ is greater than $3t_1$, and $x_1$ of closed step portion $I_1$ is smaller than $3t_1$.

Figure 1:
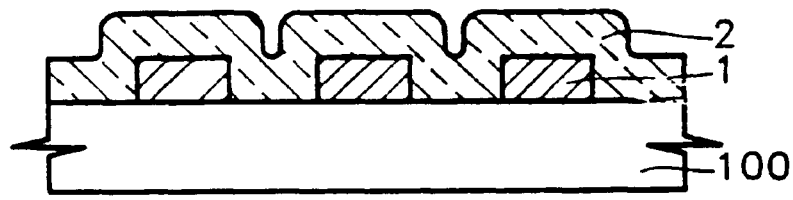
FIGS. 1 and 2 are schematic views showing the conventional BPSG reflow technique.
Figure 2:
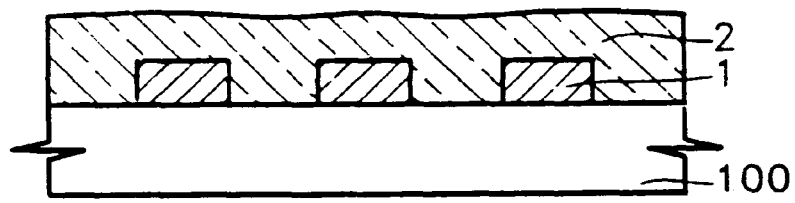
Figure 3:
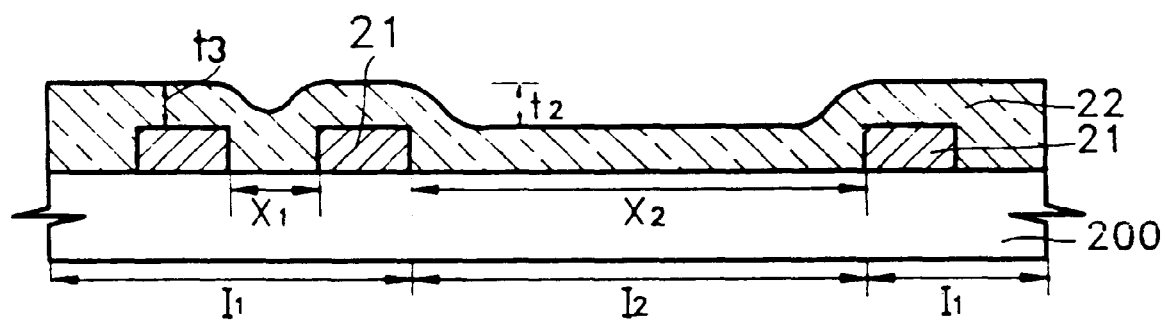
FIG. 3 shows an uneven surface of the BPSG layer formed with conventional global steps.

Referring to FIG. 4, a first insulating layer 32 is formed on the whole surface of semiconductor substrate 300 having patterns 31 thereon. The thickness of first insulating layer 32 may be adjusted in accordance with the height of pattern 31 formed on semiconductor substrate 300. Preferably, the insulating layer is thick enough to compensate for the difference $t_3$ which is the dimension between the peak height of the subsequently formed BPSG layer and the height of the BPSG layer in the global step portion and is shown in FIG. 3.

The material constituting the first insulating layer 32 preferably has a high etch selectivity with respect to the material constituting pattern 31. Although an insulating material is used in this embodiment, a conductive material may be used when forming a dummy pattern that is electrically separated from the conductive patterns. BPSG is a desirable insulating material and, as shown in FIG. 3, the reflow of the first insulating layer may be carried out by heat-treatment at a high temperature.

Next, after coating a photoresist on first insulating layer 32, the photoresist film on global step portion $I_2$ is patterned, thereby forming a suitable photoresist pattern 33. At this time, the spacing between the pattern of closed step portion $I_1$ and photoresist pattern 33 is properly varied in accordance with the shape and size of pattern 31 and the predetermined thickness of the insulating layer.

FIG. 5 illustrates a step of forming first insulating layer pattern 32' and a second insulating layer 34. Using photoresist pattern 33 as an etching mask, first insulating layer 32 is etched to form first insulating layer pattern 32' on global step portion $I_2$. This pattern 32' is the dummy pattern that compensates for the step difference between closed step portion $I_1$ and global step portion $I_2$. After removing the remaining photoresist, an insulating material is coated on the whole surface of semiconductor substrate 300, which includes pattern 31 and first insulating layer pattern 32', to form second insulating layer 34 which has a thickness of about 3,000 to 5,000 Å. As an insulating material, BPSG (which can reflow during heat-treatment) is preferred.

FIG. 6 illustrates a step of obtaining an insulating layer 34' having a planarized surface by reflowing second insulating layer 34. Here, second insulating layer 34 is heat-treated at a high temperature of 800 to 900° C. for 30 to 60 minutes to reflow second insulating layer 34 and obtain planarized insulating layer 34'. However, this high temperature step may be omitted, if necessary. For example, when pattern 31 comprises metal leads, the above heat-treatment step is omitted since it degrades metal wiring.

Second Embodiment

Figure 7:
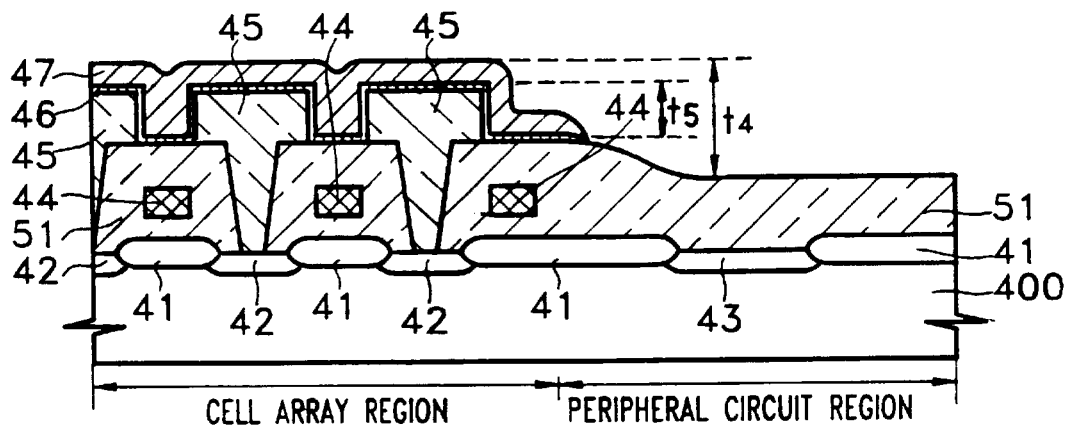
FIGS. 7, 8, and 9 are schematic views showing a second embodiment of the present invention.
Figure 8:
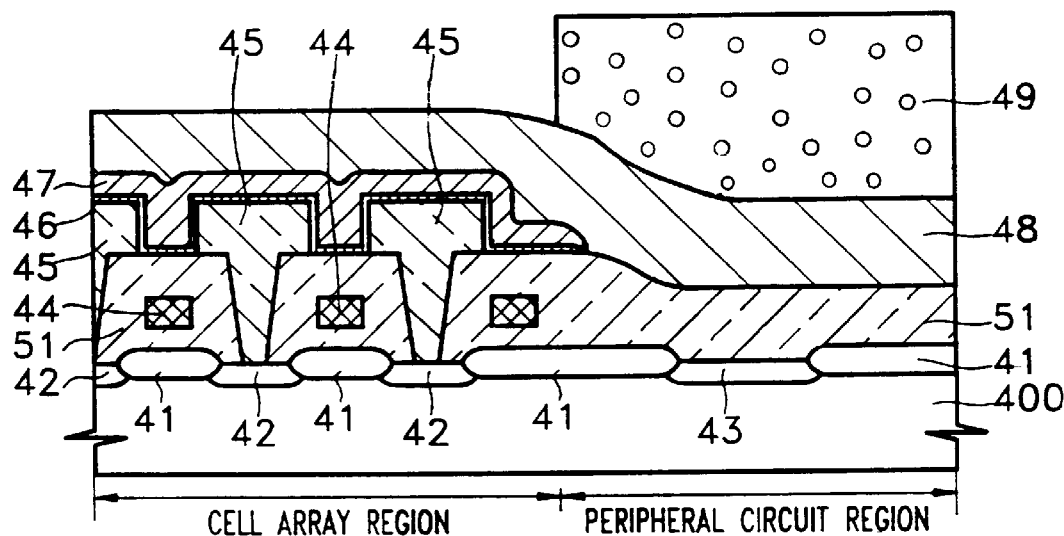
Figure 9:
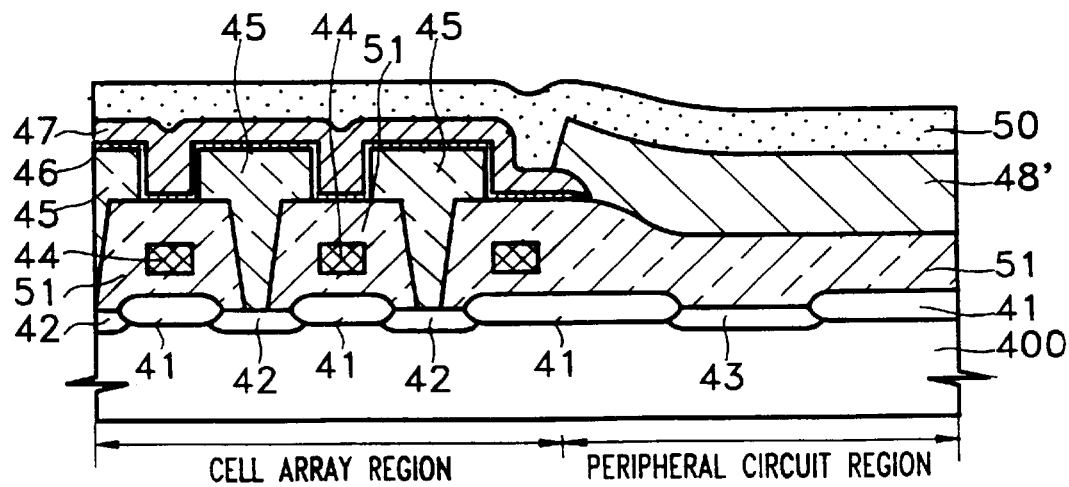

FIGS. 7, 8, and 9 are schematic views showing a second embodiment of the present invention.

Along with the increased packing density in highly integrated DRAMs, the surface area occupied by each memory cell is decreased. Due to this fact, a technique for forming a stacked capacitor has been widely used to provide sufficient capacitance for a cell capacitor. The stacked capacitor structure, although allowing decreased surface area, increases the step difference between the cell array region and peripheral circuit region. This second embodiment will describe a method of planarizing the peripheral circuit region and cell array region of a DRAM that has such a structure.

FIG. 7 illustrates a sectional view of a semiconductor memory device. Here, reference numeral 400 designates a semiconductor substrate; 41 is a field oxide layer formed on an isolating region; 42 is an impurity-doped region formed in the surface portion of the semiconductor substrate of the cell array region; 43 is an impurity-doped region formed in the surface portion of the semiconductor substrate in the peripheral circuit region; 44 is a bit line formed on field oxide layer 41 of the cell array region; 45 is a storage electrode of a stacked capacitor; 46 is a dielectric film; 47 is a plate electrode; and 51 is an insulating layer for insulating bit line 44. Impurity-doped region 42 formed in the surface portion of the semiconductor substrate of the cell array region is the source region of the transfer transistor. As can be noted in FIG. 7, the height $t_5$ of storage electrode 45 of the cell capacitor is increased, and bit line 44 is formed below storage electrode 45. In a highly integrated semiconductor memory device having the above-described structure, various elements are stacked on the cell array region while relatively few elements are formed on the peripheral region, thereby increasing the step difference to between the cell array region and the peripheral circuit region. If metal wiring is formed thereafter, notching or discontinuities in the metal wiring may occur due to the abrupt slope formed in the insulating layer at the border of the cell array region and peripheral circuit region.

FIG. 8 illustrates a step of forming a first insulating layer 48 and a photoresist pattern 49. On the whole surface of a wafer having the semiconductor device shown in FIG. 7, an insulating material, e.g., a BPSG, is deposited to a thickness of about $t_4$+5000 Å to partially compensate for step difference $t_4$. At this time, first insulating layer 48 may be heat-treated to cause it to reflow, as required. Then, after coating a photoresist on first insulating layer 48 to form a photoresist film, photoresist pattern 49 is formed on the peripheral circuit region (and not the cell array region). Photoresist pattern 49 is preferably formed to overlap one end of plate electrode 47 which extends from the cell array region to the peripheral circuit region.

FIG. 9 illustrates a step of forming a first insulating pattern 48' and a second insulating layer 50 having a planarized surface. Using photoresist pattern 49 as an etching mask, first insulating layer 48 is etched to form first insulating layer pattern 48' which is a dummy pattern. BPSG is then coated on the resultant structure to a thickness of about 3,000 to 5,000 Å to form the second insulating layer. Then, as in the first embodiment, the second insulating layer is subjected to a heat treatment at a high temperature to reflow and obtain second insulating layer 50 having a planarized surface. This heat treatment step may be omitted as explained in the first embodiment.

Third Embodiment

Figure 10:
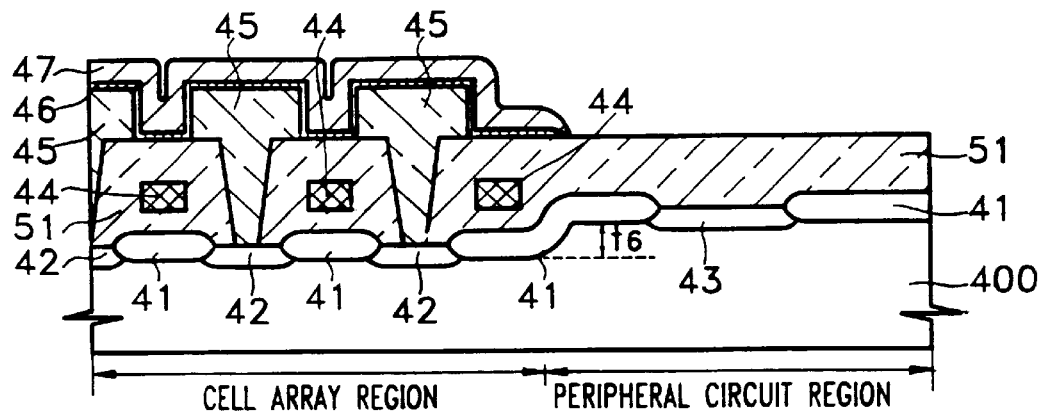
FIGS. 10, 11, and 12 are schematic views showing a third embodiment of the present invention.
Figure 11:
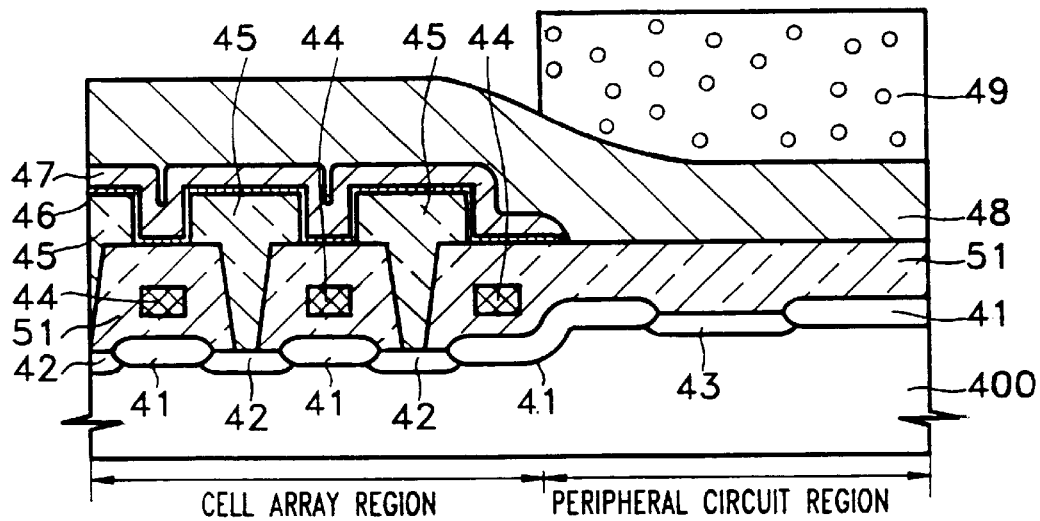
Figure 12:
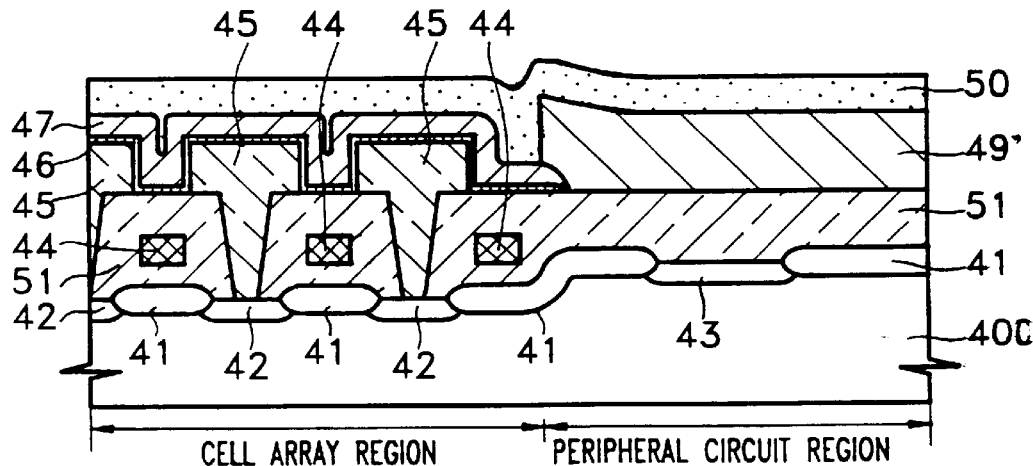

FIGS. 10, 11, and 12 are schematic views showing a third embodiment of the present invention.

This embodiment relates to DRAM structures wherein, in order to enhance the planarization of the global step portion, a recessed portion is formed on the cell array region of a semiconductor substrate, thereby increasing the planarization a semiconductor wafer having the DRAM cell array region formed on the recessed portion. The above-described method for forming the recessed portion on a semiconductor substrate of the cell array region is disclosed in U.S. Pat. No. 4,882,289.

The same reference numerals used in FIGS. 10, 11, and 12 designate like elements of the second embodiment shown in FIGS. 7, 8, and 9.

FIG. 10 illustrates a sectional view of a DRAM cell array region formed in the recessed portion of the substrate. The surface of the cell array region is below the surface of the peripheral circuit region and defines a step height $t_6$. After a recessed portion is formed in semiconductor substrate 400 of the cell array region, impurity-doped regions 42 and 43 of the cell array region and peripheral circuit region and field oxide layer 41 are formed. Then, insulating layer 51, bit line 44, storage electrode 45, dielectric film 46 and plate electrode 47 of a capacitor are formed on the surface of the resultant structure.

FIG. 11 illustrates a step of forming first insulating layer 48 and photoresist pattern 49. An insulating material, such as BPSG, is deposited to a thickness less than that of the second embodiment by as much as $t_6$, thereby forming first insulating layer 48 (as in the second embodiment) which is then heat-treated to cause it to reflow. A photoresist is then coated on first insulating layer 48 to form a photoresist film. Photoresist pattern 49 is then formed in the peripheral circuit region through a photolithography process.

FIG. 12 illustrates a step of forming first insulating layer pattern 49' and second insulating layer 50 having a planarized surface. As in the second embodiment, using photoresist pattern 49 as an etching mask, first insulating layer 48 is etched to form first insulating layer pattern 49' which is the dummy pattern. Then, the second insulating layer is formed by coating BPSG to a thickness of about 3,000 to 5,000 Å on the whole surface of the obtained structure. Finally, second insulating layer 50 is subjected to a high temperature heat treatment which causes the BPSG to reflow and produces a planarized surface. This heat treatment step may be omitted as explained in the first embodiment.

Fourth Embodiment

Figure 13:
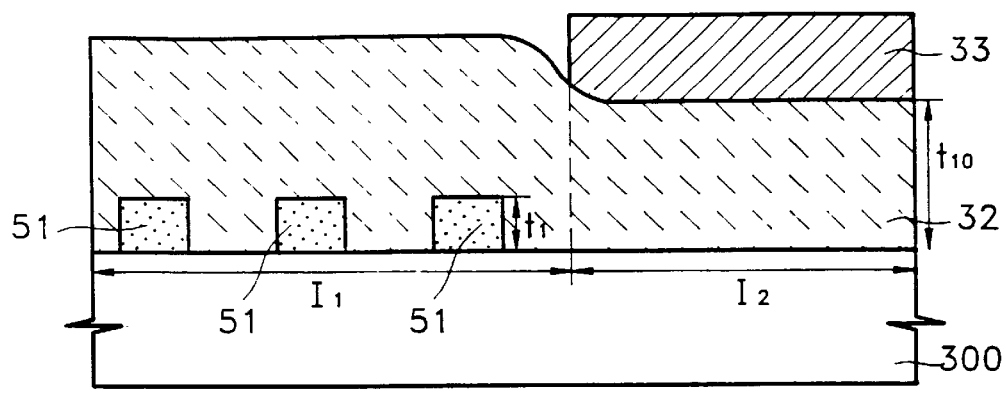
FIGS. 13 and 14 are schematic views showing a fourth embodiment of the present invention.
Figure 14:
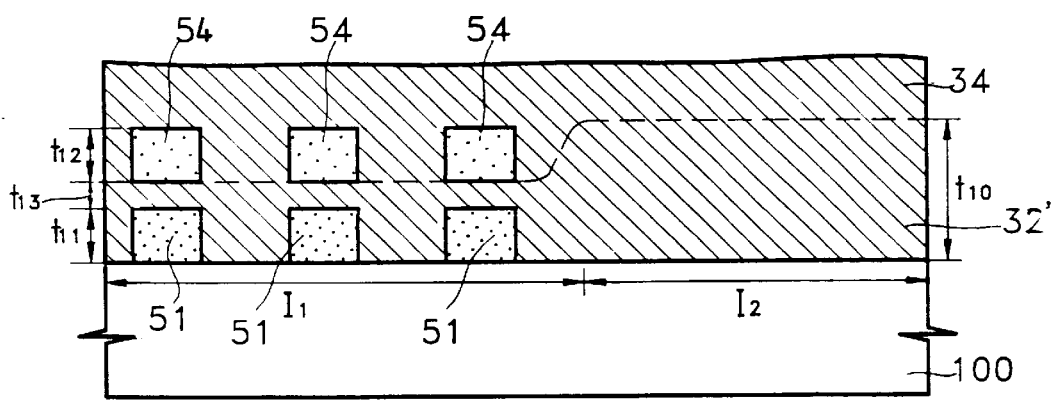

FIGS. 13 and 14 are schematic views showing a fourth embodiment of the present invention.

FIG. 13 illustrates a step of forming a photoresist pattern 33 for forming a dummy pattern which is used to compensate for the step difference. More particularly, lower patterns 51 constituting elements of a semiconductor device are formed on a lower structure such as a semiconductor substrate 300. A first insulating layer 32 is then formed on the whole surface of semiconductor substrate 300 and on the lower patterns 51 as in the first embodiment. The thickness $t_{10}$ of first insulating layer 32 is not less than a sum of $t_{11}$ and $t_{12}$ where $t_{11}$ is the height of a lower pattern and $t_{12}$ is the height of an upper pattern (54 of FIG. 14) which is to be formed in a subsequent step. First insulating layer 32 is preferably formed by using low temperature oxide (LTO) or BPSG as an insulating material.

After coating a photoresist on first insulating layer 32 to form a photoresist film, the photoresist film on global step portion $I_2$ is patterned, thereby forming a photoresist pattern 33 in the same manner as in the first embodiment.

FIG. 14 illustrates a step of forming first insulating layer pattern 32" covering lower patterns 51, upper patterns 54, and a second insulating layer 34. Using photoresist pattern 33 as an etching mask, a portion of first insulating layer 32 in the closed step portion $I_1$ is etched to form first insulating layer pattern 32" which is a dummy pattern that compensates for the step difference between closed step portion $I_1$ and global step portion $I_2$. Preferably, about ¼ to ⅓ $t_{10}$ of first insulating layer 32 in the closed step portion $I_1$ is removed to form first insulating layer pattern 32". Here, $t_{13}$ is the thickness of first insulating layer pattern 32" above lower pattern 51. First insulating pattern 32" may be optionally heat-treated causing the BPSG to reflow.

After upper patterns 54 are formed on first insulating layer pattern 32", an insulating material is coated on the whole surface of semiconductor substrate 300, upper patterns 54, and first insulating layer pattern 32" to form a second insulating layer about 2,000 to 3,000 Å thick in a manner similar to that described in the first embodiment. The second insulating layer is then heat treated causing it to reflow, thereby forming insulating layer 34 having a planarized surface. This reflow step may be omitted, as necessary, as explained in the first embodiment.

Fifth Embodiment

Figure 15:
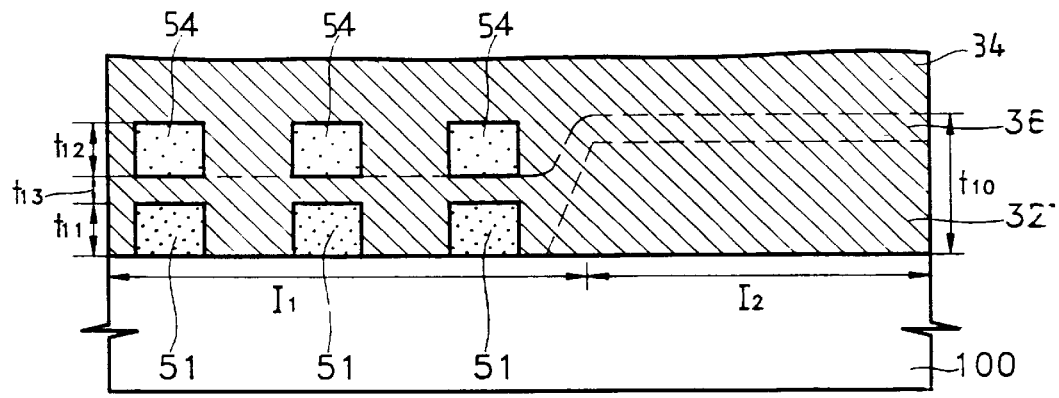
FIG. 15 is a schematic view showing a fifth embodiment of the present invention.

FIGS. 15 is a schematic view showing a fifth embodiment of the present invention.

In the same manner as in the fourth embodiment, after forming lower patterns 51 constituting elements of a semiconductor device' on a lower structure such as a semiconductor substrate 300, a first insulating layer is formed on the whole surface of semiconductor substrate 300 and on the lower patterns 51. Photoresist is then coated on the first insulating layer to form a photoresist film. The photoresist film on global step portion $I_2$ is patterned, to form a photoresist pattern. Using the photoresist pattern as an etching mask, first insulating layer in the closed step portion $I_1$ is completely removed to form first insulating layer pattern 32', which is the dummy pattern that compensates for the step difference in global step portion $I_2$.

A third insulating layer 36 is then formed on the whole surface of the resultant structure which includes first insulating layer pattern 32'. Third insulating layer 36 is formed by depositing BPSG or high temperature oxide (HTO) so that it has a thickness $t_{13}$ on lower pattern 51.

Upper patterns 54 and second insulating layer 34 are then formed on third insulating layer 36 in the same manner as in the fourth embodiment.

Sixth Embodiment

FIGS. 16 through 19 are schematic views showing a sixth embodiment of the present invention.

Figure 16:
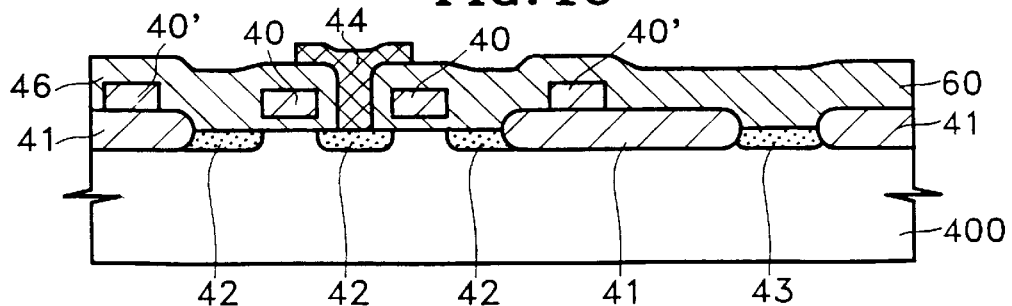
FIGS. 16 through 19 are schematic views showing a sixth embodiment of the present invention.

FIG. 16 illustrates a step for forming bit line 44 as a lower pattern. Here, reference numerals 400, 41, 42 and 43 represent the same portions as in FIG. 7. Reference numeral 40 is a gate electrode of a transistor and 40' is a word line formed on the field oxide layer. After forming a transistor consisting of source and drain regions and a gate electrode and word lines on an semiconductor substrate 300, an insulating layer 60 is formed on the whole surface of the semiconductor substrate. A contact hole for connecting a bit line with a drain region is formed and then, bit line 44 is formed and electrically connected to the drain region by a conventional interconnection process.

Figure 17:
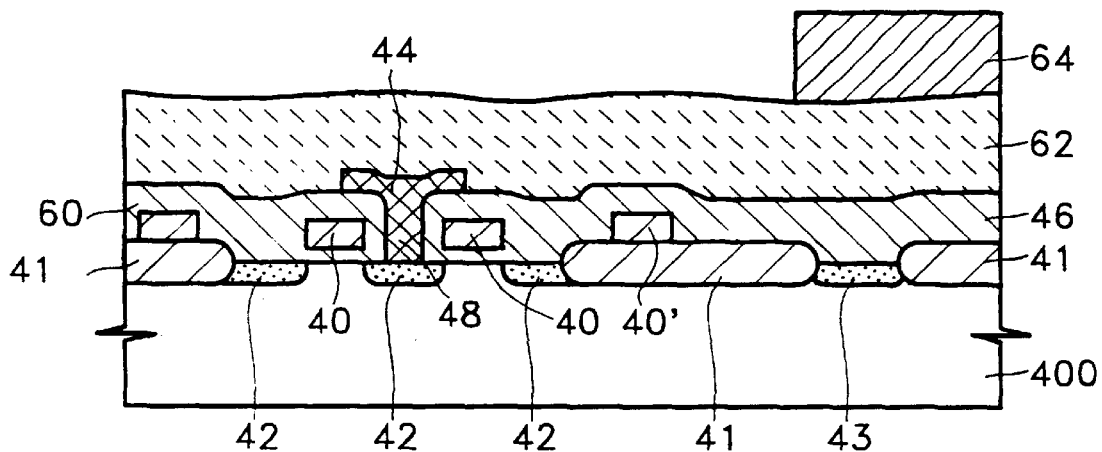

FIG. 17 illustrates a step of forming a first insulating layer 62 and a photoresist pattern 64 on the structure of FIG. 16. An insulating material, e.g., a BPSG, is deposited to a thickness of about 6000 Å to 8,000 Å to form a first insulating layer 62. First insulating layer 62 may be heat-treated to cause it to reflow, as required. Then, after coating a photoresist on first insulating layer 62 to form a photoresist film, a photoresist pattern 64 is formed in the same manner as in the second embodiment.

Figure 18:
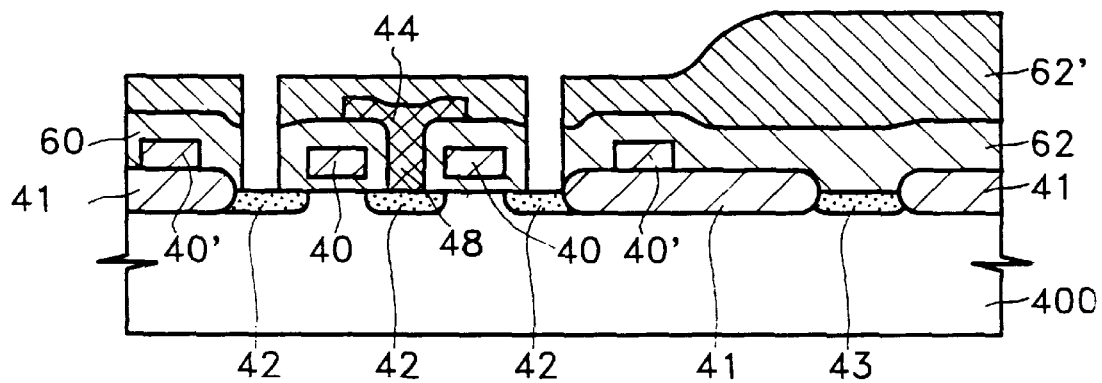

FIG. 18 illustrates a step of forming a first insulating layer pattern 62' covering bit line 44 formed on insulating layer 60 and a contact hole for connecting the storage electrode with a source region. Using photoresist pattern 64 as an etching mask, first insulating layer 62 is etched to form first insulating layer pattern 62' which is a dummy pattern that compensates for the step difference between the cell array region and peripheral circuit region as in the fourth embodiment. Although this embodiment shows that first insulating pattern 62 is formed in the same manner as in the fourth embodiment the method described in the fifth embodiment may also be utilized.

Photoresist pattern 64 is then removed and contact holes are formed for connecting a storage electrode of a capacitor with a source region. The contact holes are formed by partially removing first insulating layer pattern 62' and insulating layer 60 by a conventional photo-lithography/etch process.

Figure 19:
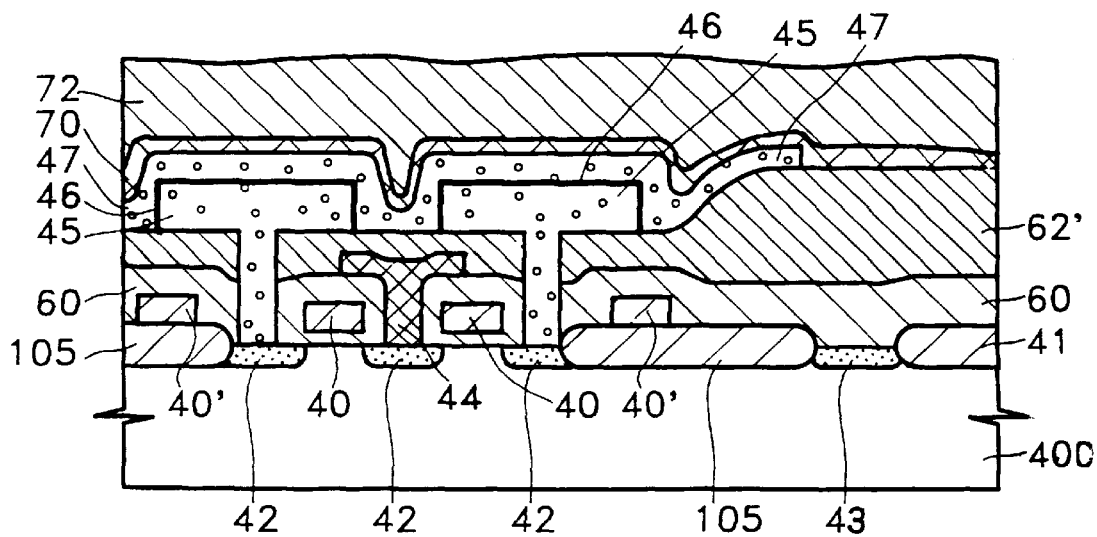

FIG. 19 illustrates a step of forming a capacitor as an upper pattern, thereby completing a semiconductor device of the present invention. After the step of FIG. 18, a first conductive layer, preferably doped polysilicon, having a thickness of about 4,000 Å to 5,000 Å is deposited, patterned, and etched to form storage electrode 45. A dielectric film 46 and plate electrode 47 are then subsequently formed to complete the capacitors of the cell array region. Then, an insulating layer 70, which protects plate electrode 47, is formed by depositing a HTO layer. An insulating material is then coated on the whole surface of the resultant structure to form second insulating layer to a thickness of about 3,000 to 4,000 Å in the same manner as in the fourth embodiment. The second insulating layer may be heat-treated to cause it to reflow and planarize the surface, thereby forming second insulating layer 72 as in the first embodiment.

According to the present invention as described above, a dummy pattern that compensates for vertical steps is formed on the global step portion, so that an insulating layer having a more nearly planar surface may be formed on a semiconductor device structure which has both closed steps and global steps. Accordingly, when performing a subsequent metallization process, the metal leads will not exhibit the effect of notching or thinning, or discontinuity due to the global steps thereby greatly enhancing the process yield and electrical characteristics of the resulting semiconductor device.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor device comprising:

a semiconductor substrate;

a cell array region formed on said semiconductor substrate;

a peripheral circuit region formed adjacent said cell array region, wherein a step difference is defined by the respective surfaces of said cell array region and said peripheral circuit region;

a dummy pattern formed on and covering substantially all of said peripheral circuit region, thereby compensating for said step difference, said dummy pattern overlapping a portion of said cell array region adjacent said peripheral circuit region; and a planarized insulating layer formed on said dummy pattern and said cell array region.

2. A semiconductor device as in claim 1, wherein said cell array region formed on said semiconductor substrate comprises a conductive pattern.

3. A semiconductor device as in claim 1, wherein said cell array region comprises a stacked capacitor having a storage electrode, a dielectric film formed on said storage electrode, and a plate electrode formed on said dielectric film.

4. A semiconductor device as in claim 1, wherein said cell array region is formed on a first portion of said semiconductor substrate and said peripheral circuit region is formed on a second portion of said semiconductor substrates the surface of said first portion being recessed relative to the surface of said second portion.

5. A semiconductor device as in claim 1, wherein said dummy pattern comprises an inorganic insulating material.

6. A semiconductor device as in claim 1, wherein said planarized insulating layer is a borophosphosilicate glass (BPSG) layer.

7. A semiconductor device comprising:

a semiconductor substrate;

an impurity-doped region formed around the surface portion of said semiconductor substrate;

a first insulating layer for defining at least one active region on said semiconductor substrate;

a cell array region including a bit line formed on said first insulating layer, a second insulating layer for insulating said bit line, and a capacitor;

said capacitor comprising a storage electrode formed on said second insulating layer and electrically connected with said impurity-doped region, a dielectric film formed on said storage electrode, and a plate electrode formed on said dielectric film;

a peripheral circuit region formed adjacent said cell array region, with said second insulating layer extending into said peripheral circuit region wherein a step difference is defined by the respective surfaces of said cell array region and said peripheral circuit region;

a dummy pattern formed on and covering substantially all of said peripheral circuit region thereby compensating for said step difference, said dummy pattern overlapping a portion of said plate electrode adjacent said peripheral circuit region; and a third insulating layer formed on said dummy pattern and over said cell array region, said third insulating layer being planarized.

8. A semiconductor device as in claim 7, wherein said cell array region is formed on a first portion of said semiconductor substrate and said peripheral circuit region is formed on a second portion of said semiconductor substrate, the surface of said first portion being recessed relative to the surface of said second portion.

9. A semiconductor device comprising:

a semiconductor substrate;

an impurity-doped region formed in the surface portion of said semiconductor substrate;

a first insulating layer for defining at least one active region on said semiconductor substrate;

a cell array region including a bit line formed on said first insulating layer, a second insulating layer for insulating said bit line, and a capacitor;

said capacitor comprising a storage electrode formed on said second insulating layer and electrically connected with said impurity-doped region, a dielectric film formed on said storage electrode, and a plate electrode formed on said dielectric film;

a peripheral circuit region formed adjacent said cell array region, with said second insulating layer extending into said peripheral circuit region;

wherein said cell array region is formed in a recessed region of said semiconductor substrate relative to said peripheral circuit region, the respective surfaces of said cell array region and said peripheral circuit region defining a step difference;

a dummy pattern for compensating for said step difference, said dummy pattern being formed on and covering substantially all of said peripheral circuit region and said dummy pattern overlapping a portion of said plate electrode adjacent said peripheral circuit region; and a third insulating layer formed on said dummy pattern and plate electrode of said cell array region, said third insulating layer being planarized.

* * * * *